(12) United States Patent
Yang et al.

(10) Patent No.: US 8,516,689 B2
(45) Date of Patent: Aug. 27, 2013

(54) METHOD OF MAKING A MULTI-LAYER INTERCONNECTING STRUCTURE

(75) Inventors: Yong Suk Yang, Daejeon (KR); In-Kyu You, Daejeon (KR); Jae Bon Koo, Daejeon (KR); Yong-Young Noh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 679 days.

(21) Appl. No.: 12/684,097

(22) Filed: Jan. 7, 2010

(65) Prior Publication Data
US 2011/0094774 A1    Apr. 28, 2011

(30) Foreign Application Priority Data
Oct. 23, 2009   (KR) .................. 10-2009-0101136

(51) Int. Cl.
  *H05K 3/36* (2006.01)
(52) U.S. Cl.
  USPC ............ 29/830; 29/825; 29/832; 29/840; 29/852
(58) Field of Classification Search
  USPC ................. 29/825, 830, 832, 840, 852
  See application file for complete search history.

(56) References Cited

U.S. PATENT DOCUMENTS

| | | | |
|---|---|---|---|
| 6,730,547 B2 | 5/2004 | Li et al. | |
| 7,176,040 B2 | 2/2007 | Sirringhaus et al. | |
| 7,183,146 B2* | 2/2007 | Yamazaki et al. | 438/151 |
| 7,732,349 B2* | 6/2010 | Yamamoto | 438/783 |
| 2002/0070382 A1* | 6/2002 | Yamazaki et al. | 257/72 |
| 2006/0116000 A1* | 6/2006 | Yamamoto | 438/795 |
| 2008/0070011 A1 | 3/2008 | Oh et al. | |

FOREIGN PATENT DOCUMENTS

| | | |
|---|---|---|
| EP | 0 272 046 | 6/1988 |
| EP | 1 473 767 A2 | 11/2004 |
| KR | 10-2001-0104237 | 11/2001 |
| KR | 10-2005-0046656 A | 5/2005 |
| KR | 2006-0097271 A | 9/2006 |
| KR | 2009-0068571 A | 6/2009 |

OTHER PUBLICATIONS

J. M. Gilbert et al.: "Via and Embedded Resistor Production in Low Cost Lithographically Printed Substrates," Electronic Components and Technology Conference, 1999, pp. 160-166.
Takeo Kawase et al. "Inkjet Printed via-Hole Interconnections and Resistors for All-Polymer Transistor Circuits", Advanced Materials, 13, No. 21, Nov. 2001, pp. 1601-1605.
C. Oldham, "Complexes of Simple Carboxylic Acid", Progress in Inorganic Chemistry, vol. 10, 1968, pp. 223-258.

* cited by examiner

*Primary Examiner* — Carl Arbes
(74) *Attorney, Agent, or Firm* — Rabin & Berdo, P.C.

(57) ABSTRACT

Provided are a multi-layer interconnection structure and a manufacturing method thereof. The multi-layer interconnection structure includes a substrate; a first wiring on the substrate; an interlayer insulation layer on the first wiring; a second wiring on the interlayer insulation layer; and a via contact including at least one conductive filament penetrating through the interlayer insulation layer between the second wiring and the first wiring to be electrically connected to the first wiring and the second wiring.

15 Claims, 7 Drawing Sheets

METHOD OF MAKING A MULTI-LAYER INTERCONNECTING STRUCTURE

CROSS-REFERENCE TO RELATED APPLICATIONS

This U.S. non-provisional patent application claims priority under 35 U.S.C. §119 of Korean Patent Application No. 10-2009-0101136, filed on Oct. 23, 2009, the entire contents of which are hereby incorporated by reference.

BACKGROUND OF THE INVENTION

The present invention disclosed herein relates to a multi-layer interconnection structure and a manufacturing method thereof, and more particularly, to a multi-layer interconnection structure including a via contact that electrically connects a plurality of wirings on the top and bottom of an interlayer insulation layer, and a manufacturing method thereof.

In general, a variety of semiconductor devices on a substrate require a multi-layer interconnection structure. A typical multi-layer interconnection structure includes a contact plug formed of a conductive metal material that penetrates through an interlayer insulation layer in order to electrically connect a plurality of wirings on the top and bottom of the interlayer insulation layer of a semiconductor device.

However, a contact plug essentially requires a photolithography process and an etch process during which a contact hole is formed to expose a bottom wiring by patterning an interlayer insulation layer on a bottom wiring. Additionally, the contact plug additionally requires a chemical mechanical polishing (CMP) process during which a conductive metal layer filled in the contact hole is removed evenly from the interlayer insulation layer.

SUMMARY OF THE INVENTION

The present invention provides a multi-layer interconnection structure and a manufacturing method thereof, which increase or maximize productivity by omitting a photolithography process and an etch process for forming a contact hole to expose a wiring below an interlayer insulation layer.

The present invention also provides a multi-layer interconnection structure and a manufacturing method thereof, which increase or maximize productivity by omitting a chemical mechanical polishing (CMP) process for removing a conductive metal layer on an interlayer insulation layer.

Embodiments of the present invention provide multi-layer interconnection structures including: a substrate; a first wiring on the substrate; an interlayer insulation layer on the first wiring; a second wiring on the interlayer insulation layer; and a via contact including at least one conductive filament penetrating through the interlayer insulation layer between the second wiring and the first wiring to be electrically connected to the first wiring and the second wiring.

In some embodiments, the conductive filament may include a conductive metal compound chain where sub-micro or nano-sized particles of a metal compound are connected to each other.

In other embodiments, the via contact further may include a top electrode formed of the metal compound between the second wiring and the conductive filament.

In still other embodiments, the metal compound may include Ag.

In even other embodiments, the interlayer insulation layer may include an organic compound.

In yet other embodiments, the interlayer insulation layer may include at least one of Poly Methyl Methacrylate (PMMA), a Polyvinyl Pyrrolidone (PVP), and Polyvinyl Alcohol (PVA).

In further embodiments, the substrate may include a glass or a flexible printed circuit board (PCB).

In other embodiments of the present invention, manufacturing methods of a multi-layer interconnection structure include: forming a first wiring on a substrate; forming an interlayer insulation layer on the substrate having the first wiring; forming a via contact that penetrates through the interlayer insulation layer by applying a conductive ink on the interlayer insulation layer disposed on the first wiring; and forming a second wiring on the via contact.

In some embodiments, the conductive ink may be formed by inkjet printing.

In other embodiments, the conductive ink may include Ag.

In still other embodiments, the Ag may be chemically combined with at least one of oxygen, sulfur, halogen, cyano, cyanate, carbonate, nitrate, nitrite, sulfate, phosphate, thiocyanate, chlorite, perchlorate, tetrafluoroborate, acetylacetonate, and carboxylate.

In even other embodiments, the conductive ink may include a metal compound.

In yet other embodiments, the conductive ink may include at least one compound of silver oxide, silver thiocyanate, silver cyanide, silver cyanate, silver carbonate, silver nitrate, silver nitrite, silver sulfate, silver phosphate, silver, silver perchorate, silver tetrafluoroborate, silver acetylacetonate, silver acetate, silver lactate, silver oxalate, and a derivative thereof.

In further embodiments, the conductive ink may include an organic solvent that dissolves the compound.

In still further embodiments, the organic solvent may include at least one of Methanol, Acetaldehyde, Acetic acid, Acetone, Amyl acetate, Amyl alcohol, Aniline, Benzaldehyde, Benzene, Butanol, Carbon disulphide, Carbon tetrachloride, Chlorine (liquid), Chlorobenzene, Cyclohexanol, Cyclohexanone, Diethylether, Dioxane, Ethanol, Ethyl acetate, Methyl ethyl ketone, Methyl isobutyl ketone, Nitrobenzene, Phenol, Toluene, Trichloroethylene, and Xylene.

In still further embodiments, the conductive ink may be embedded into the interlayer insulation layer to form a conductive filament of the via contact.

In still further embodiments, the conductive ink may form a top electrode extracted or precipitated from the top of the interlayer insulation layer.

In still further embodiments, the forming of the via contact may include performing a thermal treatment on at least one of the conductive ink and the interlayer insulation layer.

In still further embodiments, the conductive ink or the interlayer insulation layer may be thermally treated over about 120° C.

In still further embodiments, the conductive ink or the interlayer insulation layer may be heated for more than about 5 min.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the specification, these terms are only used to distinguish one element from another element. It will also be understood that when a layer (or film) is referred to as being 'on' another layer or substrate, it can be directly on the other layer or substrate, or intervening layers may also be present. In the figures, the dimensions of layers and regions are exaggerated for clarity of illustration. Also, though terms like a first and a second are used to describe various members, components, regions, layers, and/or portions in various embodiments of the present invention, the members, components, regions, layers, and/or portions are not limited to these terms. An embodiment described and exemplified herein includes a complementary embodiment thereof.

Hereinafter, a flip chip bonding method and a structure thereof according to embodiments of the present invention are described in conjunction with the accompanying drawings.

Figure 1:
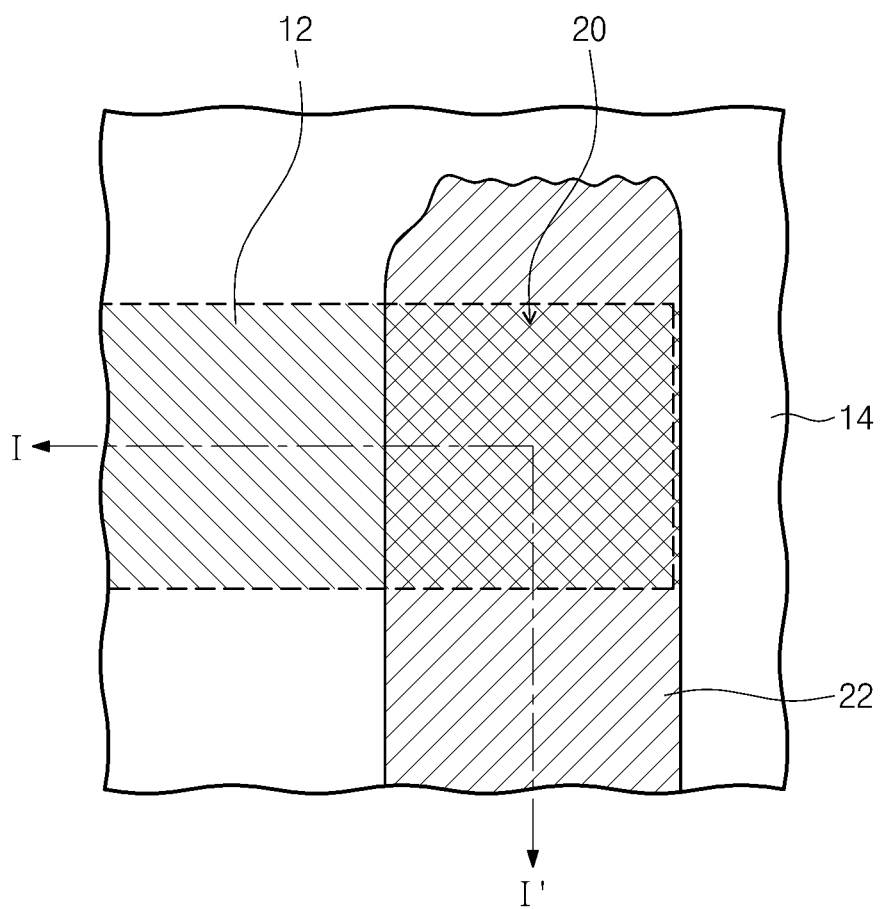
FIG. 1 is a plan view illustrating a multi-layer interconnection structure according to an embodiment of the present invention.
Figure 2:
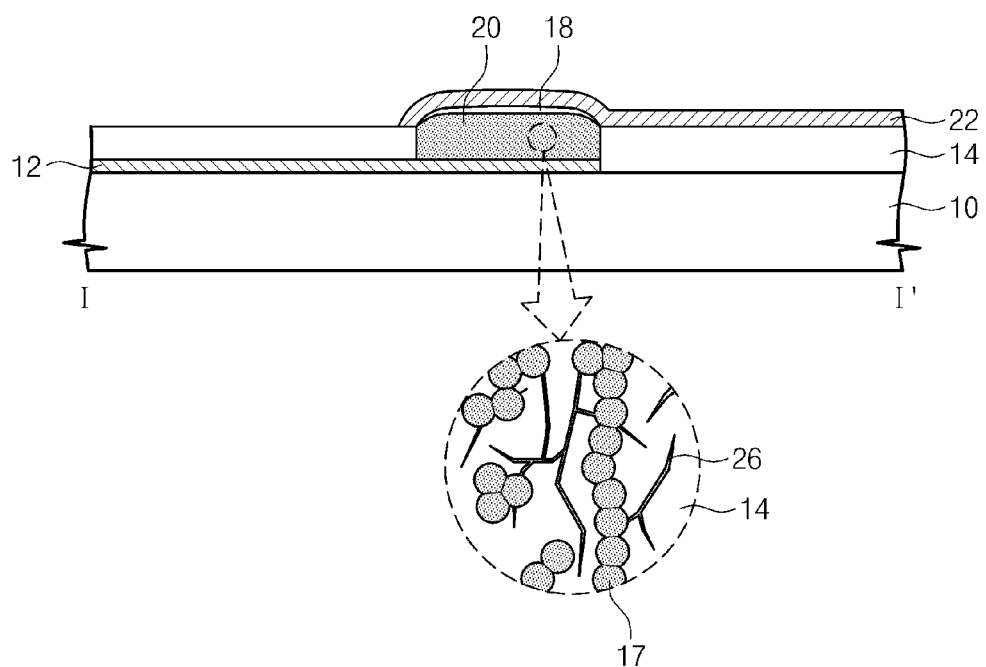
FIG. 2 is a sectional view taken along the line I-I' of FIG. 1.

FIG. 1 is a plan view illustrating a multi-layer interconnection structure according to an embodiment of the present invention. FIG. 2 is a sectional view taken along the line I-I' of FIG. 1.

As shown in FIGS. 1 and 2, the multi-layer interconnection structure includes a via contact 20 with a plurality of conductive filament 17. The plurality of conductive filament 17 vertically penetrates through an interlayer insulation layer 14 on an overlap area where a first wiring 12 and a second wiring 22 intersect in order to electrically connects the first wiring 12 and the second wiring 22.

In relation to the conductive filament 17, a conductive ink printed on the interlayer insulation layer 14 is embedded into the interlayer insulation layer to electrically connect the first wiring 12 and the second wiring 22 disposed at the top and bottom of the interlayer insulation layer 14. The conductive filament 17 includes conductive metal compound chains where sub-micro or nano-sized particles of a conductive metal compound are combined in the interlayer insulation layer 14. For example, sub-micro sized particles of a metal compound are gathered to form a conductive filament 17 in the interlayer insulation layer 14. Additionally, nano-sized particles of a metal compound are filled in the cracks of the interlayer insulation layer 14 to bridge the sub-micro sized particles of a metal compound in order to form the conductive filament 17.

Accordingly, the multi-layer interconnection structure can omit a typically-required patterning process because a conductive ink printed on the interlayer insulation layer 14 is embedded into the interlayer insulation layer 14 to form a via contact 20. Therefore, productivity can be increased or maximized.

The via contact 20 penetrates through the interlayer insulation layer 14 to be electrically connected to the first wiring 12. The via contact 20 may be directly connected to the second wiring 22, and may be electrically connected to the second wiring 22 through a top electrode 18 on the via contact 20. Accordingly, the via contact 20 may be an internal electrode formed in the interlayer insulation layer 14. The top electrode 18 may be a remaining electrode formed of a metal compound that is extracted or precipitated from the remaining conductive ink on the interlayer insulation layer 14.

The interlayer insulation layer 14 may include organic compounds that are swelled or dissolved by an organic solvent of a conductive ink. The organic compounds are generally known as carbon compounds except for a simple substance such as carbon, carbon oxide, a carbonate of a metal, a cyanide, a carbide, etc. For example, the organic compound may be formed of a polymer component including Poly Methyl Methacrylate (PMMA), a Polyvinyl Pyrrolidone (PVP), and Polyvinyl Alcohol (PVA).

An organic solvent of a conductive ink is embedded into the interlayer insulation layer 14 to swell the interlayer insulation layer 14, and a metal compound of a conductive ink can form a plurality of conductive filaments 17. This can be described that the organic solvent is embedded into an organic compound of the interlayer insulation layer 14 having an amorphous state to generate a plurality of pores and cracks 26, and then metal compounds dissolved in the organic solvent are filled in the cracks 26 in the porous organic compounds. Accordingly, a conductive ink forms the via contact 20 that penetrates from the upper surface of the interlayer insulation layer 14 to the bottom surface of the interlayer insulation layer 14 on the first wiring 12. Furthermore, a conductive ink remaining on the interlayer insulation layer 14 forms the top electrode 18 formed of extracted metal compounds when an organic solvent evaporates. The metal compounds constituting the via contact 20 and the top electrode 18 may include a metal single component.

Accordingly, the multi-layer interconnection structure includes the via contact 20 with a plurality of conductive filaments 17 that penetrate through the interlayer insulation layer 14 on the first wiring 12.

The first wiring 12 and the second wiring 22 may be electrically connected through the via contact 20 in the interlayer insulation layer 14. The first wiring 12 and the second wiring 22 may be referred to the bottom wiring and the top wiring based on the interlayer insulation layer 14 (each of them is disposed above and below the interlayer insulation layer 14), or the bottom electrode and the top electrode, respectively. For example, the first wiring 12 and the second wiring 22 include Au, Ag, Al, Cu, W, a conductive metal, and poly silicon or metal silicide doped with a conductive impurity or a conductive metal.

A substrate 10 has the even surface, and insulates the first wiring 12. For example, the substrate 10 includes a glass and a flexible printed circuit board (PCB).

A manufacturing method of the above-mentioned multi-layer interconnection structure will be described below.

FIGS. 3 through 6 are manufacturing sectional views illustrating a manufacturing method of a multi-layer interconnection structure.

Figure 3:
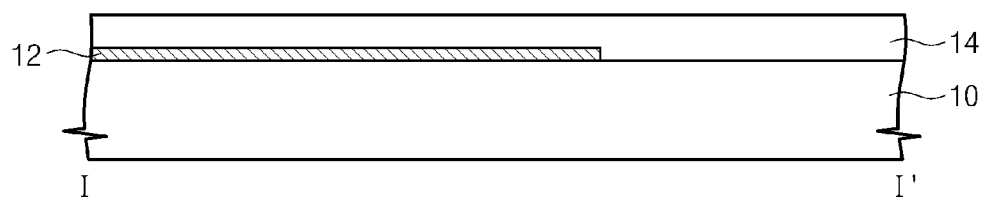
FIGS. 3 through 6 are manufacturing sectional views illustrating a manufacturing method of a multi-layer interconnection structure.

As shown in FIG. 3, according to the manufacturing method of the multi-layer interconnection structure, a first wiring 12 is formed on a substrate 10, and then an interlayer insulation layer 14 is formed on an entire surface of the substrate 10 having the first wiring 12. The first wiring 12 is formed when a conductive metal is printed or patterned on the substrate 10 formed of a glass or flexible PCB. The method of printing the conductive metal includes inkjet printing, screen printing, offset printing, aniline printing, gravure, etc. The patterning method includes a deposit process of a conductive metal, a photolithography process, and a photo-etching process. Additionally, the patterning method may include a damascene method where a chemical mechanical polishing (CMP) process is additionally performed.

Additionally, the interlayer insulation layer 14 is formed with spin coating (where the substrate 10 rotates after a liquid drop of an organic compound is dropped on the substrate 10) or dip coating (where the substrate 10 is dipped into an organic compound solution).

Figure 4:
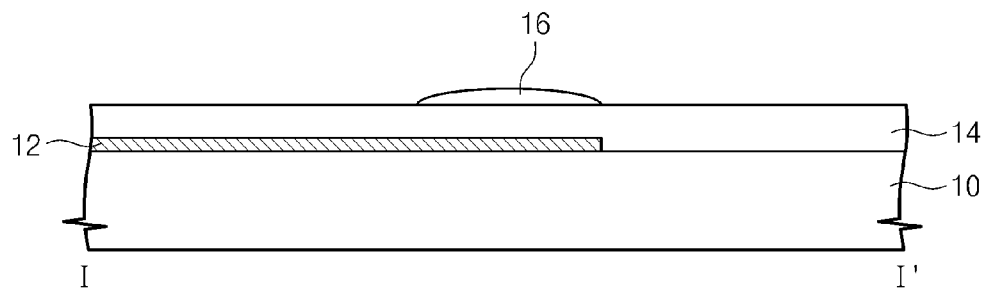

As shown in FIG. 4, a conductive ink 16 is formed on the interlayer insulation layer 14 on the first wiring 12. Here, the conductive ink 16 can be printed on the interlayer insulation layer 14 through an inkjet printing method. The inkjet printing method can minimize the consumption of the conductive ink 16 by applying it to a desired position (the top of the first wiring 12). Additionally, the inkjet printing method is simple and eco-friendly compared to a patterning method including a deposit process of a conductive metal layer, a photolithography process, and an etch process. Therefore, productivity can be improved.

The conductive ink 16 may include a conductivity excellent metal compound and a solvent for dissolving the metal compound. First, the metal compound may be formed of a compound including Ag. Ag is chemically combined with at least one of oxygen, sulfur, halogen, cyano, cyanate, carbonate, nitrate, nitrite, sulfate, phosphate, thiocyanate, chlorite, perchlorate, tetrafluoroborate, acetylacetonate, carboxylate, etc. in order to form a compound that may exist as a liquid compound.

For example, the Ag compound includes at least one compound of silver oxide, silver thiocyanate, silver cyanide, silver cyanate, silver carbonate, silver nitrate, silver nitrite, silver sulfate, silver phosphate, silver, silver perchorate, silver tetrafluoroborate, silver acetylacetonate, silver acetate, silver lactate, silver oxalate, and a derivative thereof. Accordingly, the Ag compound may exist with a liquid state where Ag is dissolved with an ion state in an acid solution.

Next, a solvent of a metal compound is typically an organic solvent such as Methanol, Acetaldehyde, Acetic acid, Acetone, Amyl acetate, Amyl alcohol, Aniline, Benzaldehyde, Benzene, Butanol, Carbon disulphide, Carbon tetrachloride, Chlorine (liquid), Chlorobenzene, Cyclohexanol, Cyclohexanone, Diethylether, Dioxane, Ethanol, Ethyl acetate, Methyl ethyl ketone, Methyl isobutyl ketone, Nitrobenzene, Phenol, Toluene, Trichloroethylene, Xylene, etc.

Figure 5:
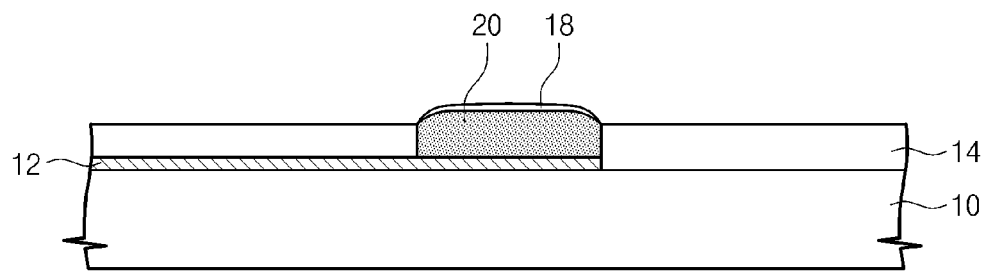

As shown in FIG. 5, after the substrate 10 is heated, a via contact 20 penetrating through the interlayer insulation layer 14 is formed. Here, an organic solvent of the conductive ink 16 embedded into the interlayer insulation layer 14 can cause pores and cracks through chemical reaction and vaporization. Additionally, a metal compound of the conductive ink 16 is filled in the pores and cracks to form a conductive filament 17. At this point, as a temperature is increased, the organic solvent of the conductive ink 16 is vaporized, and the penetrating of the metal compound into the interlayer insulation layer 14 can be accelerated.

Accordingly, because of the penetration of the conductive ink 16, the via contact 20 including a plurality of conductive filaments is formed, and thus the interlayer insulation layer 14 may swell up to a predetermined height. The conductive filaments 17 may be connected to each other with the equal distance in vertical and parallel directions. The via contact 20 may be served as an inner electrode that penetrates through the interlayer insulation layer 14 to be electrically connected to the first wiring 12.

Moreover, the metal compound that does not embedded into the interlayer insulation layer 14 and remains after a solvent is vaporized may be formed as a top electrode 18 having a predetermined thickness. The top electrode 18 may have a higher level than the interlayer insulation layer 14 and may be exposed to the atmosphere on the via contact 20.

Accordingly, in relation to the manufacturing method of the multi-layer interconnection structure, the conductive ink 16 is printed on the interlayer insulation layer 14 and is heated to form the via contact 20 penetrating through the interlayer insulation layer 14 and the top electrode 18.

At this point, the order of printing the conductive ink 16 on the interlayer insulation layer 14 and heating the substrate 10 may be inverted and may be performed simultaneously. That is, the conductive ink 16 may be printed on the heated interlayer insulation layer 14 with a high temperature, or the conductive ink 16 may be printed on the interlayer insulation layer 14 while the interlayer insulation layer 14 is heated with a high temperature. Accordingly, since a penetration speed of the conductive ink 16 is increased by a predetermined degree in proportion to the temperature of the interlayer insulation layer 14, the order of heating the interlayer insulation layer and printing the conductive ink 16 can be inverted or can be performed simultaneously.

Figure 6:
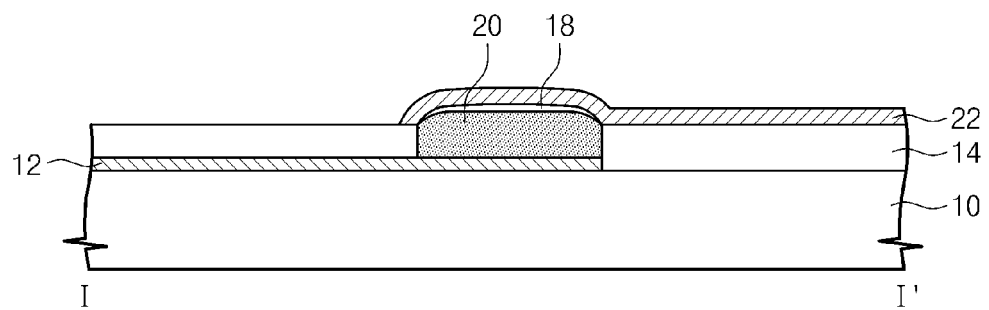

As shown in FIG. 6, the second wiring 22 is formed on the via contact 20 and the interlayer insulation layer 14. The second wiring 22 may be formed by printing a conductive metal or performing a photolithography (photo-etching) method or a damascene method like the above-mentioned first wiring 12.

In addition, an amount of the conductive ink 16 embedded into the interlayer insulation layer 14 can be increased in proportion to the thermal treatment temperature and time.

Figure 7:
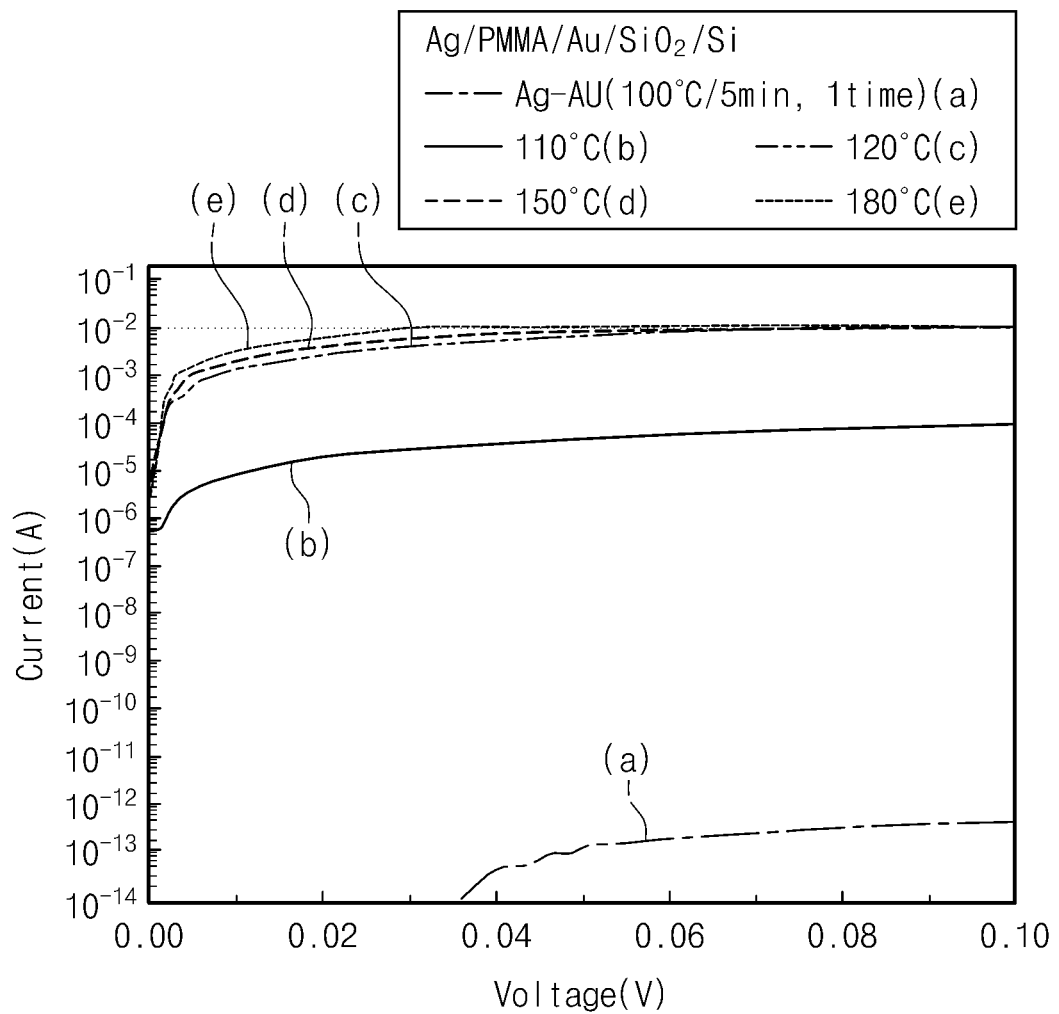
FIG. 7 is a voltage-current characteristic graph according to a thermal treatment temperature of an interlayer insulation layer and a conductive ink.

FIG. 7 is a voltage-current characteristic graph according to a thermal treatment temperature of an interlayer insulation layer and a conductive ink. It is shown that as a thermal treatment temperature of the conductive ink 16 and the interlayer insulation layer 14 is increased, a current applied to the via contact 20 is increased. Here, the interlayer insulation layer 14 includes PMMA, and the conductive ink 16 includes a silver compound and an organic solvent. The first wiring 12 includes Au.

The graphs (a) and (b) of the via contact 20 where a thermal treatment process of about 100° C. to about 110° C. is applied show that there is almost no flowing current and there is a small amount of a current, if any. However, the voltage-current graphs (c), (d), and (e) of the via contact 20 where a thermal treatment process of about 120° C. to about 180° C. is applied show that there is a flowing current of a predetermined about 10 mA at over about 50 mV. Accordingly, as the thermal treatment temperature of the interlayer insulation layer 14 and the conductive ink 16 is increased over about 120° C., the via contact 20 having an excellent conductivity can be formed.

Figure 8:
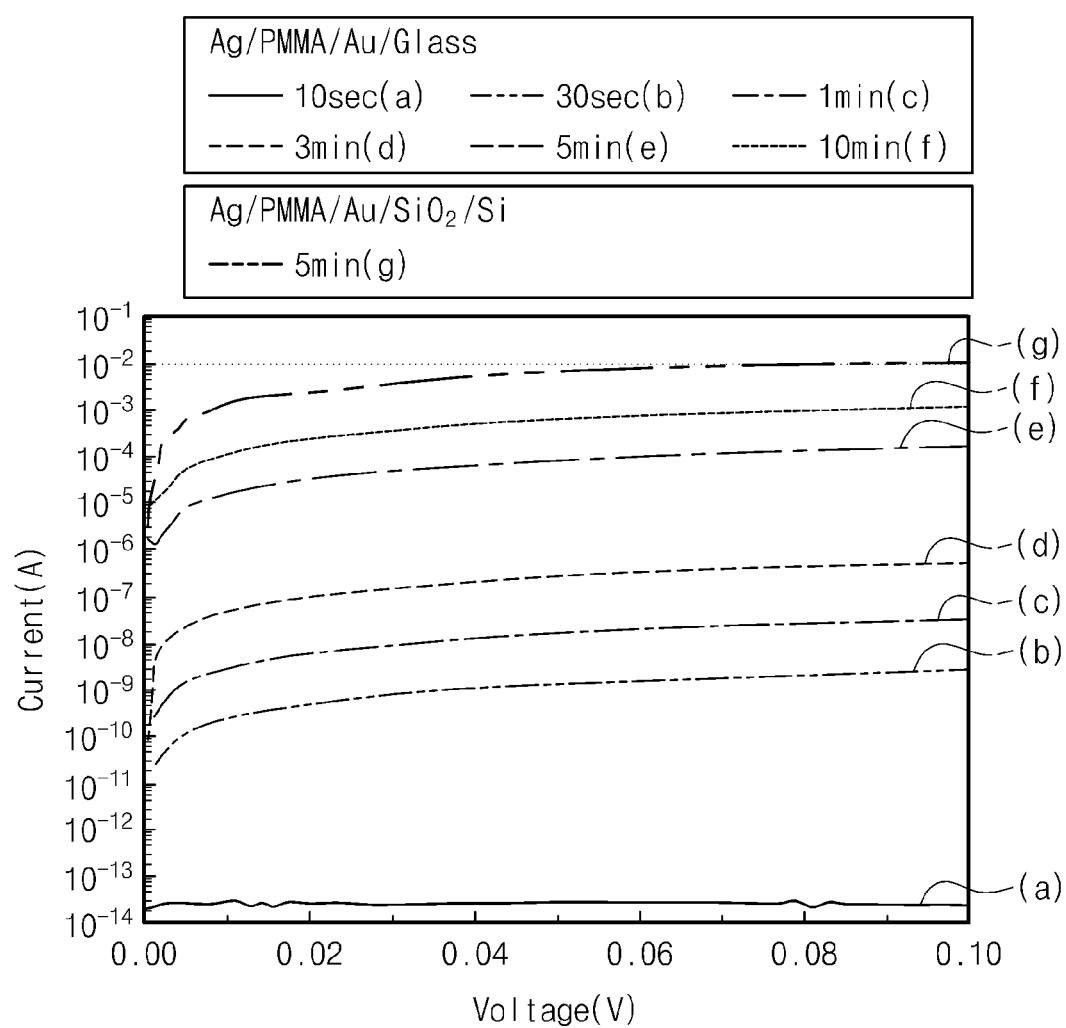
FIGS. 8 and 9 are graphs illustrating a voltage-current characteristic and a change of a resistance according to a thermal treatment time of an interlayer insulation layer and a conductive ink.
Figure 9:
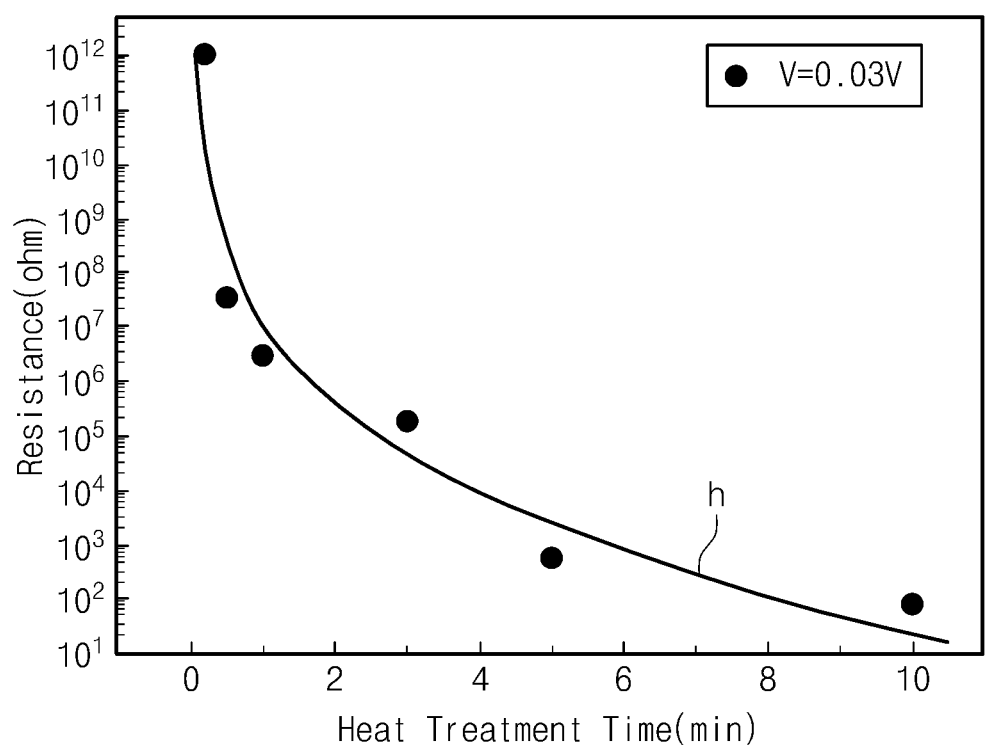

FIGS. 8 and 9 are graphs illustrating a voltage-current characteristic and a change of a resistance according to a thermal treatment time of an interlayer insulation layer and a conductive ink. As a thermal treatment time of the conductive ink 16 and the interlayer insulation layer 14 is increased, a current applied to the via contact 20 is increased and its resistance is reduced. Here, a thermal treatment of the interlayer insulation layer 14 and the conductive ink 16 on the substrate 10 of a glass material is performed for about 10 sec to about 10 min. The voltage and current characteristic graphs (a), (b), (c), (d), (e), and (f) of the via contact 20 formed through the above thermal treatment shows that a current is sequentially increased in proportion to a thermal treatment time. The voltage and current characteristic graph (g) of the via contact 20 shows that a predetermined current of about 10 mA flows when a thermal treatment of the interlayer insulation layer 14 and the conductive ink 16 on the substrate 10 where silicon and silicon oxide are stacked is performed about 5 min.

Additionally, dots shown in FIG. 9 are resistance values calculated using a current value obtained from the voltage and current characteristic graphs (a), (b), (c), (d), (e), and (f) at about 0.3 V of FIG. 8. The graph (h) representing a change of resistance values shows that a resistance value is reduced in inverse proportion to the increase of the thermal treatment time. This is because a resistance value of the via contact 20 is reduced as an amount of the conductive ink 16 embedded into the interlayer insulation layer 14 is increased in proportion to the thermal treatment time.

Accordingly, in relation to the manufacturing method of a multi-layer interconnection structure, an amount of the conductive ink 16 embedded into the interlayer insulation layer 14 is increased in proportion to the thermal treatment temperature and time of the conductive ink 16 printed on the interlayer insulation layer 14.

Moreover, an amount of the conductive ink 16 embedded into the interlayer insulation layer 14 may be increased in proportion to the number of printing the conductive ink 16 and performing a thermal treatment process.

Figure 10:
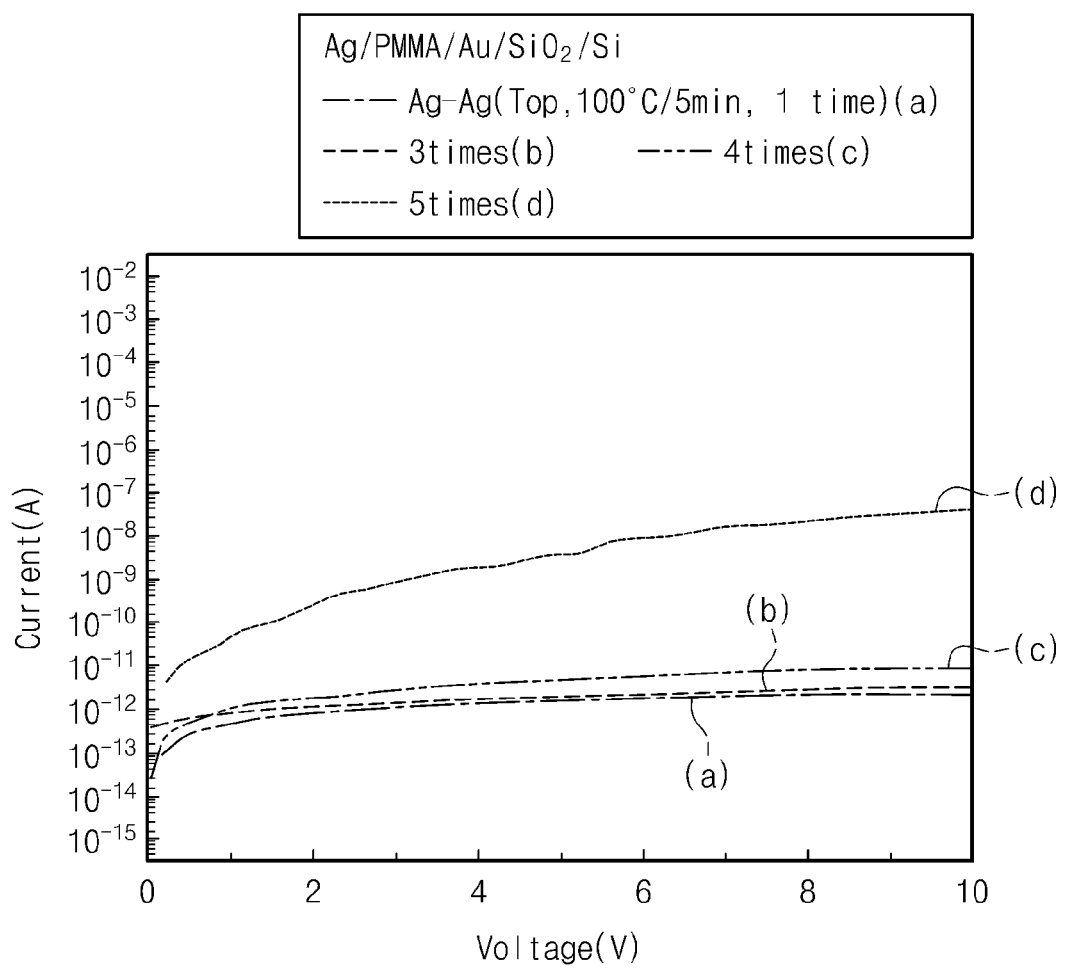
FIG. 10 is a graph illustrating a voltage and current characteristic according to an increase of the number of printing a conductive ink and performing a thermal treatment.

FIG. 10 is a graph illustrating a voltage and current characteristic according to an increase of the number of printing a conductive ink and performing a thermal treatment. It show that a current flowing into the via contact 20 is increased as the number of the printing the conductive ink 16 and performing the thermal treatment is increased. Here, after the interlayer insulation layer 14 and the conductive ink 16 are formed on the substrate 10 where silicon and silicon oxide are formed and a thermal treatment process is performed on the via contact 20 at about 100° C., voltage and current characteristics can be obtained from the via contact 20. The graph (d) of the via contact 20 where printing of the conductive ink 16 and the performing of the thermal treatment are performed five times shows more excellent voltage and current characteristic than the graphs (a), (b), and (c) of the via contact 20 where printing of the conductive ink 16 and the performing of the thermal treatment are performed one to four times.

Therefore, in relation to the manufacturing method of a multi-layer interconnection structure, an amount of the conductive ink 16 embedded into the interlayer insulation layer 14 is increased in proportion to the number of printing the conductive ink 16 and performing the thermal treatment.

As a result, according to the multi-layer interconnection structure and the manufacturing method thereof, the conductive ink 16 is printed on the interlayer insulation layer 14 between the first wiring 12 and the second wiring 22, and then is thermally treated, such that the via contact 20 penetrating through the interlayer insulation layer 14 can be formed without difficulties. Therefore, productivity can be improved. It is apparent to those skilled in the art that theses modified embodiments can be realized without difficulties based on the technical idea of the present invention.

According to configuration of the embodiments of the present invention, a conductive ink is printed on an interlayer insulation layer to form a via contact at once that penetrates through the interlayer insulation layer. The via contact can be formed more simply than a typical patterning process. Therefore, productivity can be increased or maximized.

Additionally, since a typical CMP method can be omitted by forming a via contact through an inkjet printing method of a conductive ink, productivity can be increased or maximized.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A manufacturing method of a multi-layer interconnection structure, the method comprising:
   forming a first wiring on a substrate;
   forming an interlayer insulation layer on the substrate having the first wiring;
   applying a conductive ink on the interlayer insulation layer free of a contact hole that exposes the first wiring below the interlayer insulation layer; then
   forming a via contact that penetrates through the interlayer insulation layer
   forming a second wiring on the via contact.

2. The method of claim 1, wherein the conductive ink is formed by inkjet printing.

3. The method of claim 1, wherein the conductive ink comprises Ag.

4. The method of claim 3, wherein the Ag is chemically combined with at least one of oxygen, sulfur, halogen, cyano, cyanate, carbonate, nitrate, nitrite, sulfate, phosphate, thiocyanate, chlorite, perchlorate, tetrafluoroborate, acetylacetonate, and carboxylate.

5. The method of claim 1, wherein the conductive ink comprises a metal compound.

6. The method of claim 5, wherein the conductive ink comprises at least one compound of silver oxide, silver thiocyanate, silver cyanide, silver cyanate, silver carbonate, silver nitrate, silver nitrite, silver sulfate, silver phosphate, silver, silver perchorate, silver tetrafluoroborate, silver acetylacetonate, silver acetate, silver lactate, silver oxalate, and a derivative thereof.

7. The method of claim 6, wherein the conductive ink comprises an organic solvent that dissolves the compound.

8. The method of claim 7, wherein the organic solvent comprises at least one of Methanol, Acetaldehyde, Acetic acid, Acetone, Amyl acetate, Amyl alcohol, Aniline, Benzaldehyde, Benzene, Butanol, Carbon disulphide, Carbon tetrachloride, Chlorine (liquid), Chlorobenzene, Cyclohexanol, Cyclohexanone, Diethylether, Dioxane, Ethanol, Ethyl acetate, Methyl ethyl ketone, Methyl isobutyl ketone, Nitrobenzene, Phenol, Toluene, Trichloroethylene, and Xylene.

9. The method of claim 1, wherein the conductive ink is embedded into the interlayer insulation layer to form a conductive filament of the via contact.

10. The method of claim 1, wherein the conductive ink forms a top electrode extracted or precipitated from the top of the interlayer insulation layer.

11. The method of claim 1, wherein the forming of the via contact comprises performing a thermal treatment on at least one of the conductive ink and the interlayer insulation layer.

12. The method of claim 11, wherein the conductive ink or the interlayer insulation layer is thermally treated over about 120° C.

13. The method of claim 9, wherein the conductive ink or the interlayer insulation layer is heated for more than about 5 min.

14. The method of claim 1, wherein the interlayer insulation layer has a bottom surface facing the substrate and a top surface opposite to the bottom surface, and the conductive ink is applied on the top surface that is apart from the bottom surface by a thickness of the interlayer insulation layer.

15. The method of claim 1, wherein:
- the conductive ink includes an organic solvent and a metal compound;
- the conductive ink is applied on the interlayer insulation layer disposed on the first wiring, then
- the organic solvent of the conductive ink is embedded into the interlayer insulation layer to generate pores and cracks; then
- the metal compound of the conductive ink is filled in the generated pores and cracks to form a conductive filament.

* * * * *